United States Patent [19]
Cooper et al.

[11] Patent Number: 5,774,074
[45] Date of Patent: Jun. 30, 1998

[54] MULTI-TRACK POSITION ENCODER SYSTEM

[75] Inventors: Eugene A. Cooper, Ridgefield, Wash.; Steven B. Elgee, Portland, Oreg.

[73] Assignee: Hewlett-Packard Company, Palo Alto, Calif.

[21] Appl. No.: 784,641

[22] Filed: Jan. 21, 1997

[51] Int. Cl.⁶ .................................................. H03M 1/22
[52] U.S. Cl. .................................. 341/11; 341/13; 341/15
[58] Field of Search ................................ 341/1, 2, 11, 13, 341/15

[56] References Cited

U.S. PATENT DOCUMENTS

| | | | |
|---|---|---|---|
| 4,335,306 | 6/1982 | Gort et al. | 250/231 SE |
| 4,572,952 | 2/1986 | March | 250/237 G |
| 4,602,242 | 7/1986 | Kimura | 340/347 P |
| 4,631,519 | 12/1986 | Johnston | 340/347 P |
| 4,644,157 | 2/1987 | Ozawa et al. | 250/231 SE |
| 4,736,187 | 4/1988 | Kibrick et al. | 340/347 P |
| 4,789,874 | 12/1988 | Majette et al. | 346/140 R |
| 4,803,354 | 2/1989 | Onodera et al. | 250/231 SE |
| 4,990,767 | 2/1991 | Ernst et al. | 250/231.16 |
| 5,457,371 | 10/1995 | Gordon | 318/661 |

OTHER PUBLICATIONS

Hewlett–Packard 3820A Electronic Total Station Service Manual, 1979, pp. V, 1–1, 2–17 through 2–25.

Primary Examiner—Jeffrey A. Gaffin
Assistant Examiner—Jason L.W. Kost

[57] ABSTRACT

A position encoder system is provided, such system including a code wheel, a pair of sensors, a counter, and a processor capable of identifying the correlation between separately identified markings of the code wheel. The identified correlation is indicative of code wheel accuracy, and thus is used to correct error in any angular position determined using the code wheel. A method of identifying position of the code wheel thus includes: (1) providing a disc including a first track having incremental markings of a first resolution and a second track having incremental markings of a second resolution; (2) providing a first sensor to identify markings along the first track; (3) providing a second sensor to identify markings along the second track; (4) quantifying markings of the second track during a predetermined movement of the disc; (5) identifying eccentricity by determining a difference between the quantified number of markings and a predetermined desired quantity of markings; and (6) adjusting the identified relative angular position based on the corresponding identified eccentricity.

16 Claims, 3 Drawing Sheets

MULTI-TRACK POSITION ENCODER SYSTEM

TECHNICAL FIELD

The present invention relates generally to position encoders, and more particularly, to a position encoder system whereby angular position of a rotating object may be tracked. Although the invention has broad utility, it has proven particularly well-suited for use in printers, and is described in that context of an ink-jet printer below.

BACKGROUND ART

In a conventional ink-jet printer, sheet media is drawn through the printer via a feed mechanism which includes one or more feed rollers configured to frictionally engage the sheets. The feed rollers direct consecutive sheets about an axis of rotation, the rollers being moved with precision so as to ensure quality of the print job. Roller movement, it will be understood, dictates sheet position, which in turn is important to accurate placement of an image on a sheet. Sheet position, however, typically is determined using a position encoder which may be used to identify position of the sheet.

As will be appreciated by those skilled in the art, a position encoder of the type used in a printer generally takes the form of a disc which has been provided with incremental markings for identification by an adjacent sensor. The disc (otherwise known as a code wheel) is mounted for rotation with the feed roller, preferably about a central axis of both the feed roller and the disc. As the disc rotates, the sensor and attendant structure count the number of incremental markings which pass, each marking being indicative of a predetermined angular movement of the sheet. Accordingly, it is possible to determine the angular position of a sheet relative to a reference or start position.

One problem with conventional position encoders has related to inaccuracy of position measurements due to inaccuracies of the code wheel. It will be appreciated, for example, that it may be difficult to precisely position the code wheel with its axis of rotation corresponding to its geometric center. This non-coincidence of the code wheel's axis of rotation and geometric center, known as eccentricity, will be understood to cause a cyclical error in the encoder's position measurements, typically due to resultant variations in the distance between the incremental markings as perceived by the sensor.

In the past, such code wheel inaccuracies have been addressed by employing strict tolerances when mounting the code wheel, or by employing a relatively large code wheel. This, however, has led to increased printer cost, due either to increased accuracy required in the assembly operation or to increased material costs. What is needed is a position encoder system capable of identifying inaccuracies in the code wheel such that they may be taken into consideration when identifying position of the code wheel.

SUMMARY OF THE INVENTION

The foregoing problems are addressed by provision of a position encoder system which includes a code wheel, a pair of sensors, a counter, and a processor capable of identifying the correlation between separately identified markings of the code wheel. Such correlation is indicative of code wheel accuracy, and thus may be used to automatically correct error in any angular position determined using the code wheel.

In the preferred embodiment, the code wheel takes the form of a disc having first and second tracks, each track including a series of incremental markings. A first sensor identifies markings along the first track. A second sensor identifies markings along the second track, the markings of the second track typically being at a resolution higher than that of the first track. The counter quantifies the number of markings identified by the second sensor during a predetermined angular movement of the code wheel, such movement typically corresponding to the movement between identification of adjacent markings by the first sensor. The processor then determines accuracy by comparing the quantified number of markings to a predetermined desired quantity of markings (assuming a code wheel without eccentricity error). The difference between the quantified number of markings and the desired quantity of markings is a measure of eccentricity error. The processor then adjusts the relative measure of angular position based on the corresponding eccentricity error of the code wheel.

The invented position encoder system thus may be implemented via a method which includes the steps of: (1) providing a disc mounted for rotation about a first axis, the disc including first and second tracks, the first track having incremental markings of a first resolution and the second track having incremental markings of a second resolution; (2) providing a first sensor to identify markings along the first track; (3) providing a second sensor to identify markings along the second track; (4) quantifying markings of the second track during a predetermined movement of the disc; (5) identifying eccentricity by determining a difference between the quantified number of markings and a predetermined desired quantity of markings, the desired quantity of markings typically corresponding to a ratio of the second resolution to the first resolution; and (6) adjusting the identified relative angular position based on the corresponding identified eccentricity.

These and other objects and advantages of the present invention will be understood more readily upon consideration of the drawings and the detailed description of the preferred embodiment which is set forth below.

DETAILED DESCRIPTION OF THE PREFERRED EMBODIMENT AND BEST MODE FOR CARRYING OUT THE INVENTION

Figure 1:
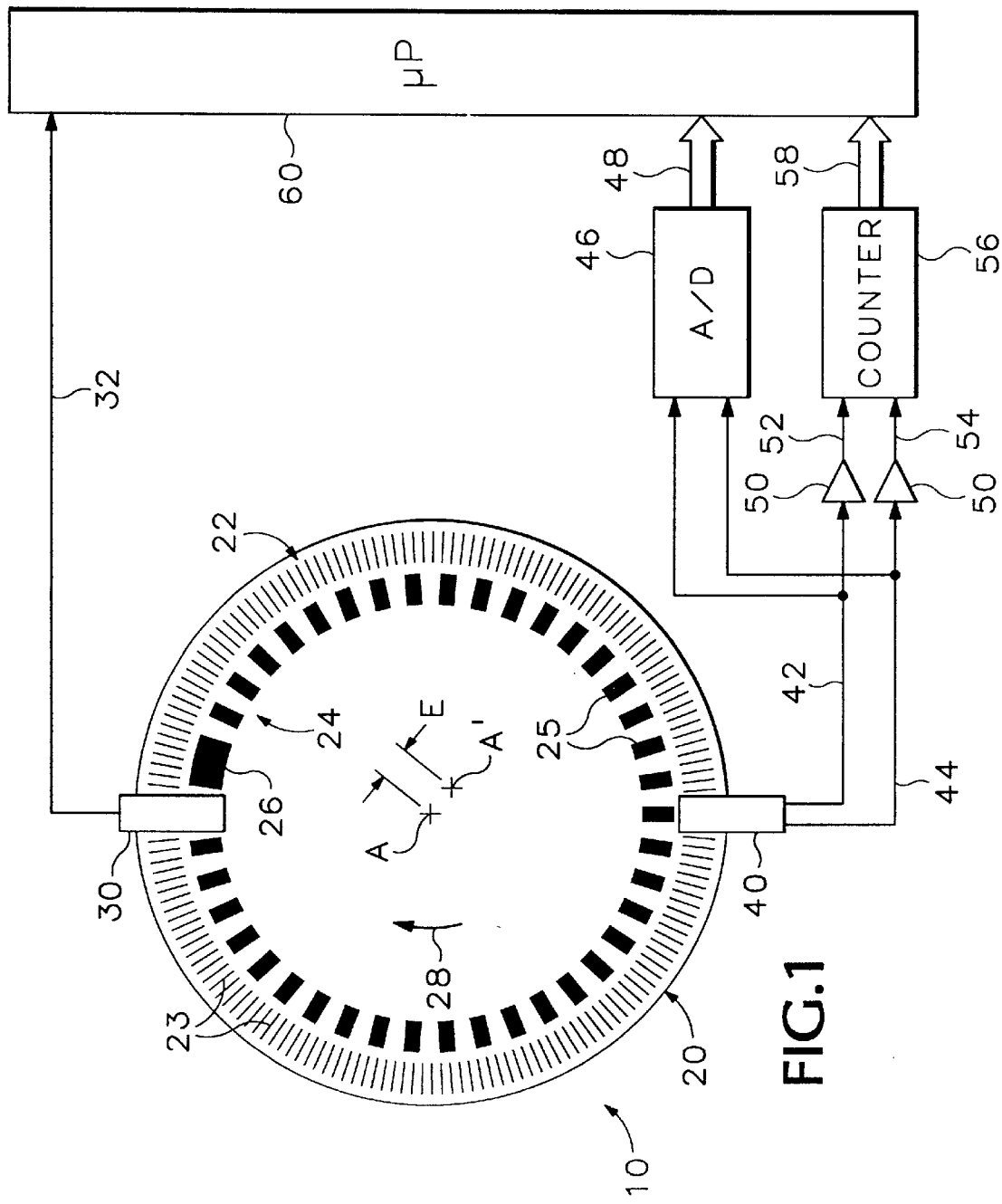
FIG. 1 is a schematic view of a position encoder system constructed in accordance with a preferred embodiment of the invention.

Referring initially to FIG. 1, a position encoder system constructed in accordance with a preferred embodiment of the invention is shown generally at 10. As indicated, the depicted system has broad utility, but is described herein for use in a device such as an ink-jet printer where accurate positioning of an object is required. It will be appreciated, for example, that inaccurate positioning of the printer's feed rollers (which direct advancement of print media) may lead to a variety of problems, including color banding, improper spacing, or even overlap of printed lines of text.

In the depicted embodiment, position encoder system 10 is configured for use in identifying the angular position of feed rollers (not shown) which rotate about an axis A'. This is accomplished using a code wheel which takes the form of a disc 20, such disc also being mounted for rotation about axis A'. Ideally, the axis of rotation of the disc corresponds to its geometric center A, but more typically, the actual axis of rotation A' will be offset from the disc's geometric center due to allowed inaccuracies in assembly of the printer. In the depicted embodiment, such offset is represented by eccentricity E, a measurement which may vary both in direction and in amplitude.

Referring still to FIG. 1, it will be noted that the code wheel defines a pair of tracks 22, 24, each with a series of incremental markings 23, 25. One or more of the incremental markings (i.e. marking 26) may be adapted to identify a particular position (i.e., a start position) along the code wheel. Marking 26, for example, is three times the width of the other markings to indicate the predetermined home or start position of the code wheel. Accordingly, when determining code wheel position, measurements are taken relative to the start position defined by marking 26.

The tracks typically define a pair of concentric rings, generally following the disc perimeter so as to accommodate identification thereof. The inner track (or first track) 24 is a low resolution track, including a first predetermined number of equally-spaced incremental markings. The outer track (or second track) 22 is a high resolution track, including a second predetermined number of equally-spaced incremental markings which is greater than the number of markings along the first track. Accordingly, first track 24 has a first resolution, and second track 22 has a second resolution greater than the first resolution.

Because the first track is of a lower resolution than the second track, it will be understood that each marking of the first track will correspond to a plurality of markings of the second track. This accommodates determination of a desired correlation between the number of markings along a predetermined portion of the first track and the number of markings along a corresponding portion of the second track. Such correlation may be defined as a ratio of markings of the first track to markings of the second track. In the preferred embodiment, the first track includes forty-eight markings, and the second track includes nine-hundred-sixty markings. Accordingly, each marking of the first track corresponds to twenty markings of the second track. This ratio is represented only schematically by the markings shown in FIG. 1.

In accordance with our teachings, encoder system 10 includes a pair of sensors (typically optical sensors) 30, 40 configured to identify incremental markings along the first and second tracks of the disc. The first sensor 30 is positioned to identify markings along first track 24 as the disc rotates. The second sensor 40 is diametrically opposed from first sensor 30, and is positioned to identify markings along second track 22 as the disc rotates. By identifying the markings of different tracks with a different sensors, it is possible to provide different perspectives on the position of the code wheel. The correlation, or lack of correlation, between the identified positions provides an indication of code wheel accuracy. A microprocessor 60 (referred to in the drawings as "$\mu P$") thus is employed to compare a number of markings actually identified relative to a predetermined desired number of markings in order to determine accuracy of the code wheel.

Figure 2:
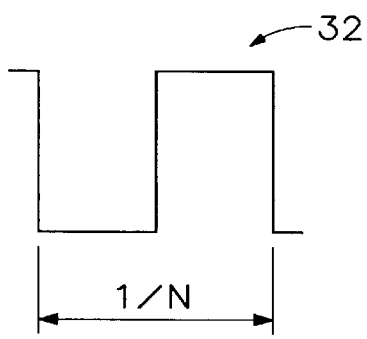
FIG. 2 shows an output wave form of a first sensor which forms a part of the position encoder system depicted in FIG. 1.

Sensor 30 produces one or more first output signals 32, each having a frequency corresponding to the resolution of the first track. In the depicted embodiment, the first sensor produces a single output signal 32 which takes the form of square wave (FIG. 2). The period of the first signal is 1/N, where N is the number of incremental markings along the first track (e.g. forty-eight). Each period corresponds to a predetermined movement of the code wheel between an initial position wherein the first sensor identifies an initial marking and a subsequent position wherein the first sensor identifies a next adjacent marking, consecutive markings being identified by rising (or falling) edges of the square wave. The code wheel thus may be considered to move in incremental steps, each step corresponding to a marking identified along the first track. It will be appreciated, however, that the code wheel typically moves continuously during a given print operation, the incremental steps representing predetermined segments of code wheel motion.

Figure 3:
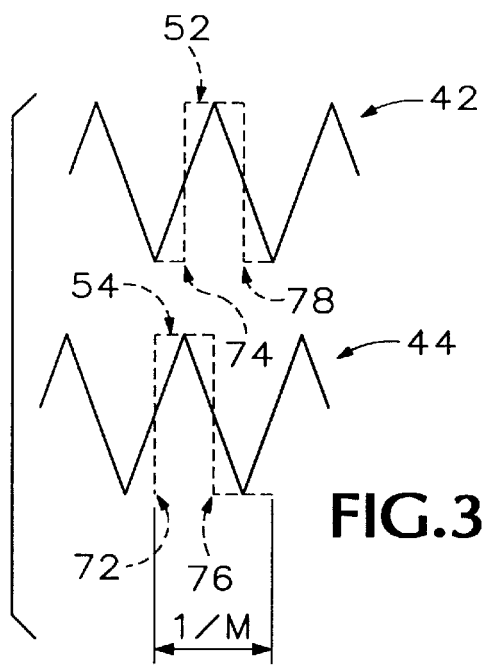
FIG. 3 shows output wave forms of a second sensor which forms a part of the position encoder system depicted in FIG. 1.

Sensor 40 produces one or more second output signals 42, 44, each having a frequency corresponding to the resolution of the second track. As indicated in FIGS. 1 and 3, the second output signals are continuous wave forms, typically taking the form of phase-shifted triangle waves (wave form 44 is phase-shifted 90-degrees relative to wave form 42). The period of each second signal is 1/M, where M is the number of incremental markings along the second track (e.g. nine-hundred-sixty). Accordingly, the period of the first output signal is twenty times that of the second output signal.

The phase-shifted second outputs allow for differentiation between rising and trailing edges of the triangle waves, and correspondingly accommodate continuous-value quantification of the markings along the second track. It is to be noted, for example, that each triangle wave is communicated to an analog-to-digital converter 46 (referred to in the drawings as "A/D") so as to provide digital representations of the triangle wave amplitudes. The triangle waves also are passed through an amplifier 50 which produces corresponding phase-shifted square waves 52, 54 (FIG. 3), each of which is passed to an up/down counter 56. The amplitudes of the triangle waves, in combination with the count produced by counter 56, allow for identification of continuous positions along the second track (continuous-value quantification).

The counter is configured to count both rising and trailing edges of the square waves, providing for increased resolution of the system. It will be noted, for example, that counter 56 will count edges 72, 74, 76, and 78 for each period of the second outputs. The counter thus will count four times during passage of each marking of the second track. The resolution is further enhanced by the triangle wave amplitudes which identify the precise position of the code wheel.

Figure 4:
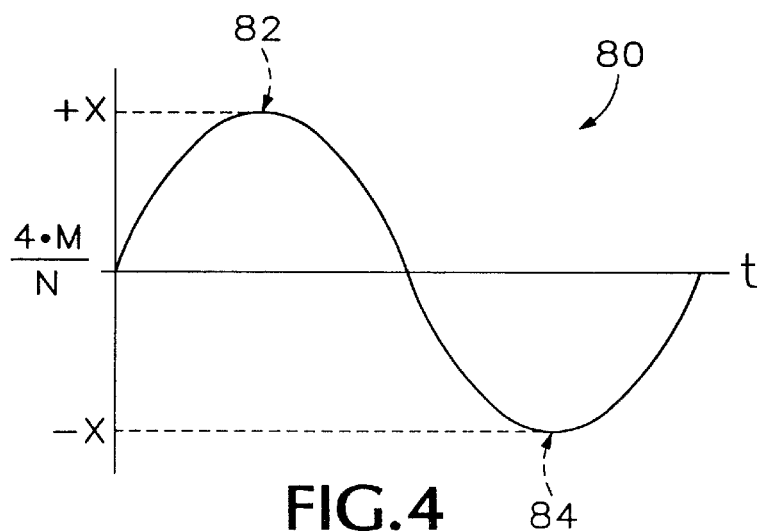
FIG. 4 shows a wave form demonstrating eccentricity error of a typical code wheel prior to correction.

During each predetermined movement of the code wheel, the counter quantifies markings of the second track. Where the code wheel's geometric center corresponds to its axis of rotation, the counter will count 4M/N (80 in the preferred embodiment) during each such movement. This corresponds to the predetermined desired quantity of markings. However, where the code wheel is not positioned precisely, the counter's count will vary according to the eccentricity of the code wheel. Such variance (also referred to as eccentricity error) is represented by a sine wave (shown at 80 in FIG. 4) where amplitude corresponds to eccentricity error. The period of the sine wave typically will correspond to a single revolution of the code wheel, the maximum eccentricity error being represented as ±X (shown at 82, 84).

As indicated, microprocessor 60 is operatively connected to the first sensor, the second sensor (via the analog-to-digital converter), and the counter so that it may determine eccentricity error. This is accomplished by comparing the quantity of incremental markings of the second track with a predetermined desired quantity of incremental markings of the second track, the desired quantity of incremental markings being determined based on the known relationship between incremental markings of the first track and incremental markings of the second track as described above.

By determining the phase and amplitude of eccentricity error, it will be appreciated that is possible to adjust the identified relative angular position of the code wheel to correct eccentricity error. This typically is accomplished using a table which includes error correction data corresponding to selected positions of the code wheel. Alternatively, eccentricity error may be determined with each movement of the code wheel and appropriate correction may be made at that time.

In the preferred embodiment, this eccentricity error is determined upon initial setup, eccentricity error being determined by:

(1) Recording drive roller encoder values (Dre) of track 2 for each marking-to-marking transition of track 1 (Dre(0), Dre(1), ... Dre(47));

(2) Finding kmax such that (delta(k+1)+delta(k)+delta(k−1))=Dre(k+1)−Dre(k−2) is maximum (where delta is the difference between successive encoder values (i.e., Dre(k)−Dre(k−1) for k=0 to 47));

(3) Finding kmin such that (delta(k+1)+delta(k)+delta(k−1))=Dre(k+1)−Dre(k−2) is minimum;

(4) Determining eccentricity magnitude (E)=C*(delta(kmax)−delta(kmin))=C*(Dre(kmax)−Dre(kmax−1)−Dre(kmin)+Dre(kmin−1)); and (5) Determining the offset position of eccentricity (Ae)= (Dre(kmax)+Dre(kmin))/2±960 whichever is less than 3840.

In the depicted embodiment, track 1 is a 48 line/rev (inner track), track 2 is a 960 line/rev (outer track); C=48/4/π/R/(1/r1+1/r2), R=drive roller radius (1 inch); r1=track 1 radius (0.63 inch), and r2=track 2 radius (0.76 inch).

Accordingly, it is possible to correct for eccentricity error for a predetermined movement (Y) of the code wheel in accordance with the following expression:

$$Pc=Po+Y+R*E/r1*(\text{Sin}(2\pi(Po+Y-Ae)/3840)-\text{Sin}(2\pi(Po-Ae)/3840))$$

where Pc=corrected position; Po=initial position; E=eccentricity magnitude from calibration; Ae=offset of eccentricity from calibration; and 3840 is the total quantity of counts corresponding to the second track of the code wheel.

Figure 5:
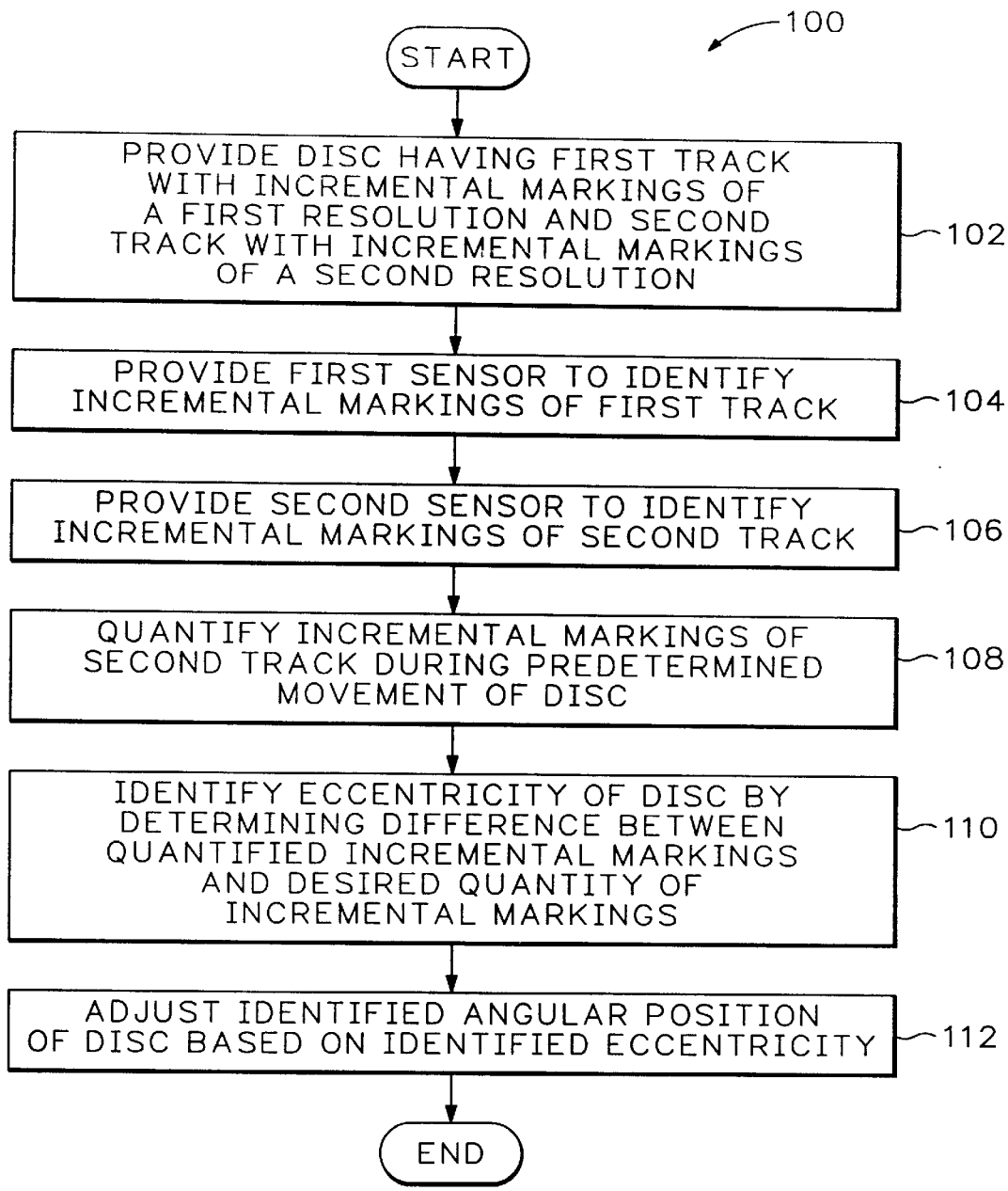
FIG. 5 is a flowchart demonstrating a method of identifying relative angular position of an object in accordance with a preferred embodiment of the invention.

The foregoing system thus follows a method set forth generally at 100 in FIG. 5. The method provides for identification of relative angular position of an object which rotates about a first axis, the method including steps of: (1) providing a disc having a first track with incremental markings of a first resolution and a second track with incremental markings of a second resolution (shown generally at 102); (2) providing a first sensor adjacent the first track to identify incremental markings of the first track as the disc rotates (shown generally at 104); (3) providing a second sensor adjacent the second track (and angularly offset from the first sensor) to identify incremental markings along the second track as the disc rotates (shown generally at 106); (4) quantifying the identified incremental markings of the second track during a predetermined movement of the disc to identify a relative angular position of the disc after the predetermined movement (shown generally at 108); (5) identifying eccentricity by determining a difference between the quantity of incremental markings identified on the second track after the predetermined movement and a desired quantity of incremental markings, the desired quantity of incremental markings corresponding to a ratio of the second resolution to the first resolution (shown generally at 110); and (6) adjusting the identified relative angular position based on the corresponding identified eccentricity (shown generally at 112).

Predetermined movement is defined as movement of the disc from an initial position wherein the first sensor identifies an initial incremental marking of the first track to a subsequent position wherein the first sensor identifies a next adjacent incremental marking of the first track. In the preferred embodiment, the quantifying incremental markings step and identifing eccentricity step are repeated for each incremental movement of the code wheel, and the determined eccentricity errors are stored in a table to provide an eccentricity curve for the code wheel. Eccentricity data thus need only be collected upon initial set-up of the printer.

While the present invention has been shown and described with reference to the foregoing operational principles and preferred embodiment, it will be apparent to those skilled in the art that other changes in form and detail may be made therein without departing from the spirit and scope of the invention as defined in the appended claims.

We claim:

1. A position encoder system for use in determining relative angular position of an object rotating about a first axis, the position encoder system comprising:

a disc mounted for rotation about the first axis with the object, said disc having a first track with incremental markings of a first resolution, and a second track with incremental markings of a second resolution greater than said first resolution;

a first sensor configured to identify incremental markings along said first track of said disc as the disc rotates;

a second sensor spaced from said first sensor, said second sensor being configured to identify incremental markings along said second track of said disc as the disc rotates;

a counter operatively connected to said second sensor to quantify incremental markings identified by said second sensor, said counter thereby being configured to track relative angular position of the disc; and a processor operatively connected to said counter and said first sensor for use in identifying a correlation between a predetermined portion of said first track and a quantity of incremental markings of said second track, said correlation being indicative of disc accuracy.

2. The position encoder system of claim 1, wherein said second sensor produces one or more analog output signals, said analog output signals providing for a continuous-value quantification of said incremental markings.

3. The position encoder system of claim 2, wherein said processor is configured to determine a difference between said continuous-value quantification and a predetermined desired count, said difference being a measure of disc accuracy.

4. The position encoder system of claim 3, wherein a determined relative angular position of said object is corrected based on said difference between said continuous-value quantification and said predetermined desired count.

5. The position encoder system of claim 1, wherein said first and second tracks define concentric rings on said disc.

6. The position encoder system of claim 5, wherein said first and second sensors are diametrically opposed.

7. A position encoder system for use in determining relative angular position of an object rotating about a first axis, the position encoder system comprising:

a disc mounted for rotation with the object about the first axis, said disc including concentric first and second tracks, said first track having incremental markings of a first resolution and said second track having incremental markings of a second resolution greater than said first resolution;

a first sensor positioned adjacent said first track of said disc to identify said incremental markings of said first track as said disc rotates, said first sensor producing a first output signal having a frequency corresponding to said first resolution;

a second sensor positioned adjacent said second track of said disc and diametrically opposed from said first sensor to identify incremental markings along said second track as said disc rotates, said second sensor producing one or more second output signals, each having a frequency corresponding to said second resolution;

a counter operatively connected to said second sensor to receive said second output signals for use in quantifying incremental markings of said second track during a predetermined movement of said disc; and a processor operatively connected to said first sensor, said second sensor, and said counter, said processor being configured to determine eccentricity of said disc by comparing said quantity of incremental markings of said second track with a predetermined desired quantity of incremental markings of said second track, said processor further being configured to adjust the relative measure of angular position based on the corresponding determined eccentricity of said disc.

8. The position encoder system of claim 7, wherein said second sensor produces one or more analog output signals which provide for a continuous-value quantification of said incremental markings of said second track during each predetermined movement of said disc.

9. The position encoder system of claim 8, wherein said processor is configured to determine a difference between said continuous-value count and said predetermined desired quantity of incremental markings, said difference being a measure of eccentricity of said disc during said predetermined movement of said disc.

10. The position encoder system of claim 7, wherein said desired quantity of incremental markings is defined by a product of (1) a quantity of incremental markings of said first track identified during said predetermined movement of said disc, and (2) a ratio of said second resolution over said first resolution.

11. The position encoder system of claim 7, wherein said predetermined movement of said disc results in relative movement of an incremental marking of said first track past said first sensor.

12. The position encoder system of claim 7, wherein said processor determines eccentricity of said disc for consecutive movements of said disc through a complete revolution of said disc.

13. A method for identifying relative angular position of an object which rotates about a first axis, said method comprising the steps of:

providing a disc mounted for rotation with the object about the first axis, the disc including concentric first and second tracks, the first track having incremental markings of a first resolution and the second track having incremental markings of a second resolution;

providing a first sensor adjacent the first track to identify incremental markings of the first track as the disc rotates;

providing a second sensor adjacent the second track and diametrically opposed from the first sensor to identify incremental markings along the second track as the disc rotates;

quantifying incremental markings of the second track during a predetermined movement of the disc to identify a relative angular position of the disc after the predetermined movement;

identifying eccentricity by determining a difference between the quantity of incremental markings identified on the second track after the predetermined movement and a desired quantity of incremental markings, the desired quantity of incremental markings corresponding to a ratio of the second resolution to the first resolution; and adjusting the identified relative angular position based on the corresponding identified eccentricity.

14. The method of claim 13, wherein said predetermined movement is defined as movement of the disc from an initial position wherein the first sensor identifies an initial incremental marking of the first track to a subsequent position wherein the first sensor identifies a next adjacent incremental marking of the first track.

15. The method of claim 13, wherein said quantifying incremental markings step and said identifying eccentricity step are repeated for consecutive predetermined movements of the disc to provide an eccentricity curve for the disc.

16. The method of claim 13, wherein said second sensor produces one or more analog output signals for use in determining a continuous-value quantification of said incremental markings of said second track.

* * * * *